(12) United States Patent
Hanington

(10) Patent No.: US 11,558,037 B2
(45) Date of Patent: Jan. 17, 2023

(54) HIGH EFFICIENCY HIGH VOLTAGE PULSE GENERATOR

(71) Applicant: Gary Hanington, Elko, NV (US)

(72) Inventor: Gary Hanington, Elko, NV (US)

(*) Notice: Subject to any disclaimer, the term of this patent is extended or adjusted under 35 U.S.C. 154(b) by 33 days.

(21) Appl. No.: 17/199,401

(22) Filed: Mar. 11, 2021

(65) Prior Publication Data

US 2022/0190810 A1 Jun. 16, 2022

Related U.S. Application Data

(60) Provisional application No. 63/123,958, filed on Dec. 10, 2020.

(51) Int. Cl.
*H03K 3/012* (2006.01)
*H05G 1/20* (2006.01)

(52) U.S. Cl.
CPC ............. *H03K 3/012* (2013.01); *H05G 1/20* (2013.01)

(58) Field of Classification Search
CPC  H03K 3/012; H03K 3/57; H03K 3/55; H03K 3/12; H02M 3/07; H02M 3/075; H02M 3/073; H02M 1/0032; H02M 1/0025; H02M 1/0045; H02M 1/007; H02M 1/08; H02M 1/36
See application file for complete search history.

(56) References Cited

U.S. PATENT DOCUMENTS

| | | | |
|---|---|---|---|
| 2,211,668 A | 8/1940 | Michel | |
| 3,379,882 A | 4/1968 | Youmans | |
| 4,264,823 A | 4/1981 | Sloughter et al. | |
| 9,001,956 B2 | 4/2015 | Groves | |
| 9,069,095 B1 | 6/2015 | Beekman et al. | |
| 10,408,968 B2 | 9/2019 | Sorroche et al. | |
| 2012/0113688 A1* | 5/2012 | Liang | H02M 3/33569 363/21.12 |
| 2012/0306407 A1* | 12/2012 | He | H05B 45/382 315/297 |
| 2017/0099011 A1* | 4/2017 | Freeman | H02M 7/06 |
| 2019/0199114 A1* | 6/2019 | Tseng | B60L 53/22 |

* cited by examiner

*Primary Examiner* — Sibin Chen
(74) *Attorney, Agent, or Firm* — Thorpe North & Western LLP

(57) ABSTRACT

A high voltage pulse generator is disclosed. The high voltage pulse generator comprises a pulse generating transformer having a primary coil with a first side and a second side, and a secondary coil with a first side and a second side. A direct current (DC) voltage source connection is at the first side of the primary coil. A first high frequency power driver transistor is coupled between the second side of the primary coil and a ground connection. The first high frequency power driver transistor is configured to operate in an on-mode for a selected time period to charge the primary coil for the selected time period based on a switching frequency of the first high frequency power driver transistor, and switch the first high frequency power driver transistor to an off-mode at the switching frequency to release the charge from the primary coil to the secondary coil. A diode is coupled between the first side of the secondary coil and a pulsed voltage output that is configured to be connected to a high voltage device. The diode configured to direct a flow of charge from the secondary coil to charge a capacitance of the high voltage device to a rising pulse leading edge of a voltage pulse.

16 Claims, 14 Drawing Sheets

HIGH EFFICIENCY HIGH VOLTAGE PULSE GENERATOR

RELATED APPLICATIONS

The present application claims the benefit of U.S. Provisional Patent Application No. 63/123,958, filed Dec. 10, 2020 with a docket number of 2901-008.PROV, the entire specification of which is hereby incorporated by reference in its entirety for all purposes.

BACKGROUND

Embodiments of the invention relate to a method and apparatus for generating a high voltage electrical pulse that can be used to operate a number of different applications, including an ion source within a sealed neutron generating tube. To increase logging resolution, newer types of neutron generating tubes utilize sophisticated ion sources that present higher values of capacitance that must be driven with voltages at faster rise times. As downhole temperature requirements increase, ion source driver topologies with higher efficiencies offer great value. Although the apparatus for generating a high voltage electrical pulse is primarily designed for the operation of such tubes, it can be used anywhere a variable electrical high voltage pulse signal is required, such as in the running of microwave radar equipment.

In the past fifty years the use of neutron activation analysis for oil well logging has yielded positive success for identifying regions of petroleum accumulation. Basically, neutron well logging methods can determine the porosity of the geologic earth formations surrounding a borehole by irradiating the rock with neutrons and measuring the resulting spatial distribution of signals, usually gamma rays, coming back from the artificial and temporary radioactivity created in the surrounding material. To establish a neutron flux, special tubes have been constructed over the years to take advantage of certain fusion reactions that can occur between deuterium and tritium, both heavy isotopes of hydrogen, that yield neutrons as a by-product. Within a neutron generating tube, a device comparable in size to an old fashion radio receiving tube, a beam of deuterium ions are electrically accelerated into a target saturated with either deuterium, tritium, or a combination of both. The ensuing nuclear fusion reaction liberates neutrons that exit the tube and can irradiate nearby material. As an example of operation, if the rock formation contained chloride atoms (from salt water) the unique gamma radiation released by such an irradiated atom will allow a determination of the porosity of the rock formation outside of the borehole. The porosity value is an important indicator for hydrocarbon accumulation.

The design and operation of sealed neutron generating tubes has been well documented over the last 80 years. Their history starts in 1940 when F. Penning disclosed a neutron generator (U.S. Pat. No. 2,211,668) constructed of a low pressure deuterium-filled envelope containing a cathode and anode and advances in this technology continues on to today with newer types utilizing nano-structure field emission components such as disclosed by J. Navarro-Sorroche and W. Guo, (U.S. Pat. No. 10,408,968), September 2019. Since oil-well logging is usually a lucrative business, there are many financially driven reasons to improve such tubes to provide more neutrons per second or offer higher resolution in the strata logging profiles.

All neutron generating tubes require an ion source. FIG. 1 shows a typical design for a basic neutron tube. For many years the "Penning" ion source has been employed extensively because it offers many advantages. The design is simple and robust because they have a cold cathode giving a long service life. A Penning ion source can supply large discharge currents for low pressures and they have a high extraction yield (from 10% to 40%).

Generally, neutrons are segregated into several categories on the basis of their energy. Thermal neutrons are those that are in thermal equilibrium with matter and, in special cases, have a Maxwellian distribution of velocities. In this distribution, the most probable velocity at 295 Kelvin (K) is 2200 meters per second (m/sec), corresponding to an energy of 0.025 electron volts (eV).

Neutrons in the energy range 0.5-10 kilo eV (keV) are called intermediate neutrons. These neutrons may also be called resonance or epithermal neutrons. Fast neutrons are those in the energy range 10 keV to 10 Mega eV (MeV). In this energy range, neutrons interact with matter through elastic collisions (i.e., billiard-ball-type collisions). Neutrons with energies >10 MeV are called relativistic neutrons.

The operation of an ion source is described by Groves (U.S. Pat. No. 9,001,956B), saying "the source is disposed in a pressurized environment containing an ionizable gas where ion source voltage supply circuitry provides a positive voltage potential between the substrate and the grid of the ion source to cause ionization of the gas and emission of ions through a grid."

To power such electrostatic ion sources, a potential of up to 2 kilovolts (kV) (positive) is applied to a metal structure within the tube, simply called the ion source, as illustrated in FIG. 1, which is equipped with an exiting hole. This voltage causes ions, such as $D_2+$, to emerge from the ion source as a beam. Once the beam has cleared the ion source it is accelerated towards the target by a very high negative voltage (up to 100 kV) provided by another power supply, sometimes called the Very High Voltage (VHV) supply. As mentioned earlier, the deuterium ions hit the target and interact with the heavy hydrogen isotopes inside resulting in a fusion reaction that produces neutrons within a few microseconds after the ion source has been turned on. The initial source of the deuterium ions is usually a heated metal cathode that contains absorbed deuterium. This is not shown in this application for brevity.

Depending on the data being sought, the ion source can be either run non-stop or pulsed on and off during the logging process. In the first case, the ion source is left on continuously at a selected voltage, such as +2,000 volts, resulting in a steady production of neutrons irradiating the rock formations outside the well as the logging probe is lowered (or raised) within the borehole. By knowing the speed of the tool and its movement, a log of porosity as a function of depth may be generated from the detected ensuing gamma radiation. In one embodiment, the gamma ray detectors can be located within the probe.

More commonly though, the neutron tube is pulsed on and off during operation because this mode offers some advantages. This was initially stated in A. Youmans (U.S. Pat. No. 3,379,882—1967), where the formations can be irradiated with neutrons from a periodically varying source. In this mode, the disclosure says, the ion source was provided with a varying positive voltage whose repetition frequency was approximately 2,500 cycles per second, being thus alternately on and off for periods of 200 microseconds each. When the ion source is switched on and off, the result is the switching on and off of the neutron output. By synchronizing the pulses of the neutron source with the detecting system this technique allows more information to be determined. From the time the source is turned off, the exponential decay of signals from the induced artificial radioactivity of the surrounding material can be used to help identify the rock formation by comparing this data to known energy and half-life information. In addition, by measuring the number of thermal neutrons present at any particular time the rate of decay of the thermal neutron population may be also measured. Because the rate of decay is dependent upon the nuclei of the material present in the rock, the rate of decay can vary from formation to formation. This rate of decay is also related to the time required for these nuclei to capture slow neutrons and for the thermal neutrons to diffuse away; therefore, the measurement is related to this time and hence to the lifetime of the neutrons in the formations and to the albedo of the formations.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Reference will now be made to the exemplary embodiments illustrated, and specific language will be used herein to describe the same. It will nevertheless be understood that no limitation of the scope of the invention is thereby intended.

EXAMPLE EMBODIMENTS

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Figure 1:
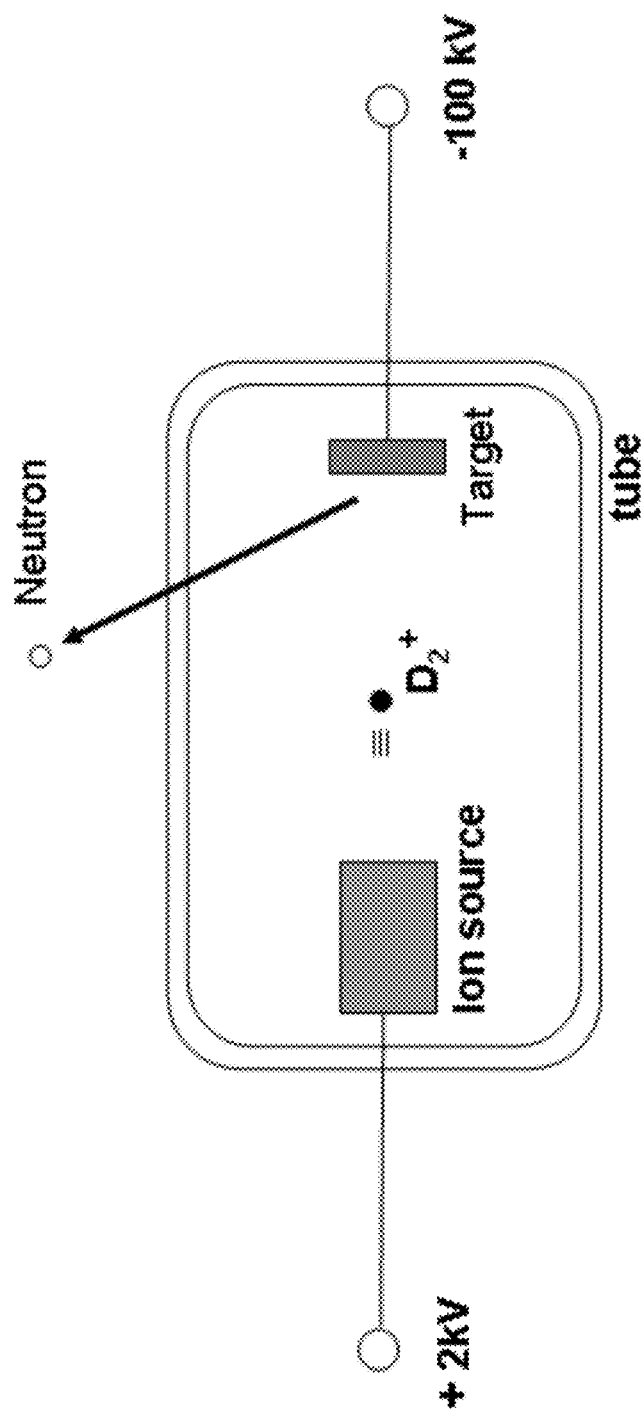
FIG. 1 illustrates a diagram of a neutron tube, in accordance with an example.
Figure 2A:
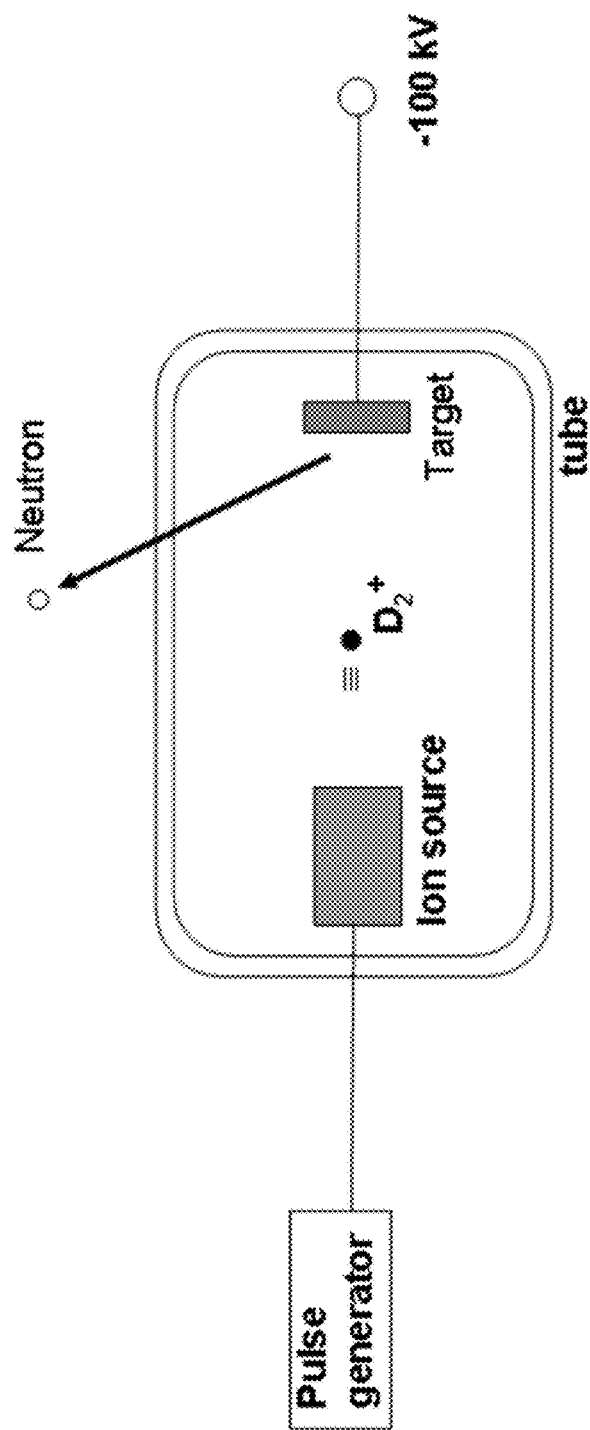
FIG. 2a illustrates a neutron tube coupled to a pulser power supply in accordance with an example.
Figure 2B:
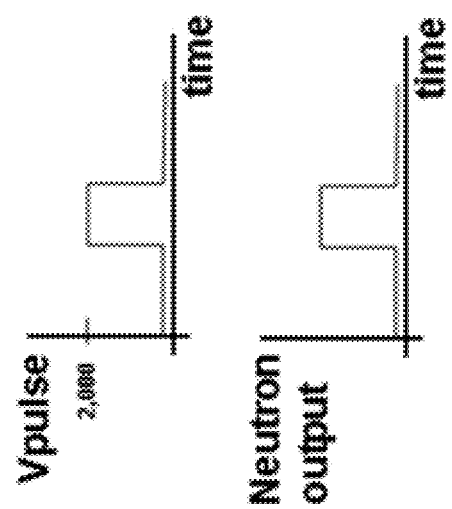
FIG. 2b provides a diagram of a voltage waveform from the pulser power supply and a corresponding neutron pulse in accordance with an example.

As mentioned in Sloughter et al. (U.S. Pat. No. 4,264, 823), for typical well logging operations, the on-time of the neutron generator tube when working in a pulsed mode will usually not exceed a duty cycle of approximately 5-10% of its operating cycle. This is usually due to power dissipation reasons in the target material. Neutron pulse durations can vary from 10 µS ON to several hundred microseconds and repetition rates of 100-20,000 pulses per second are typical. Because gamma ray emission and decay profiles from irradiated atoms may occur very quickly after irradiation, (depending upon the element), it is vitally important that the tube and neutron generation process be controllable to a high degree of precision with respect to on and off profiles. FIG. 2a provides an example illustration of a neutron tube coupled to a pulser power supply, referred to in the figure as a pulse generator. The pulser power supply can provide a high voltage pulse. It is desirable that the pulse has a steep slope as it is turned on and off when powering the ion source. This creates a neutron pulse with a related rectangular shape, as illustrated in FIG. 2b. The more rectangular a neutron burst the greater the logging resolution. Hence, the more rectangular the high voltage pulse that drives the ion source, the greater the precision one can obtain during the logging operation, because as mentioned earlier, the probe is moving up or down within the borehole being logged.

To generate ions, a high voltage potential is required to strip an electron from the stable deuterium molecule. In the case of a continuous neutron output, the high voltage is switched on once at the start of the run and switched off when the neutron beam is to be stopped. A simple high voltage power supply that can provide a steady DC voltage is often used because there is no concern for the time profile of the neutron burst, although there may be a desire to vary the potential of the ion source electrode in order to keep the neutron flux constant.

More often though, as mentioned above, sophisticated logging systems use the pulsing of neutron emissions from the tube. This is accomplished by turning on and off the ion source voltage, and the faster this can be accomplished the more accurate the resulting log can be. To generate a high voltage pulse, in the order of +2,000 volts with a rise time of 1 microsecond, while operating in a hostile temperature environment (up to 175 degrees Celsius) is a tall order, especially when one realizes that the power supply usually has to fit in a tubular shape with a diameter of approximately 0.5 to 1.5 inches and typically be less than 2 to 8 inches long. One example of a power supply is a diameter of approximately 1.25 inches with a length less than 8 inches.

Figure 3A:
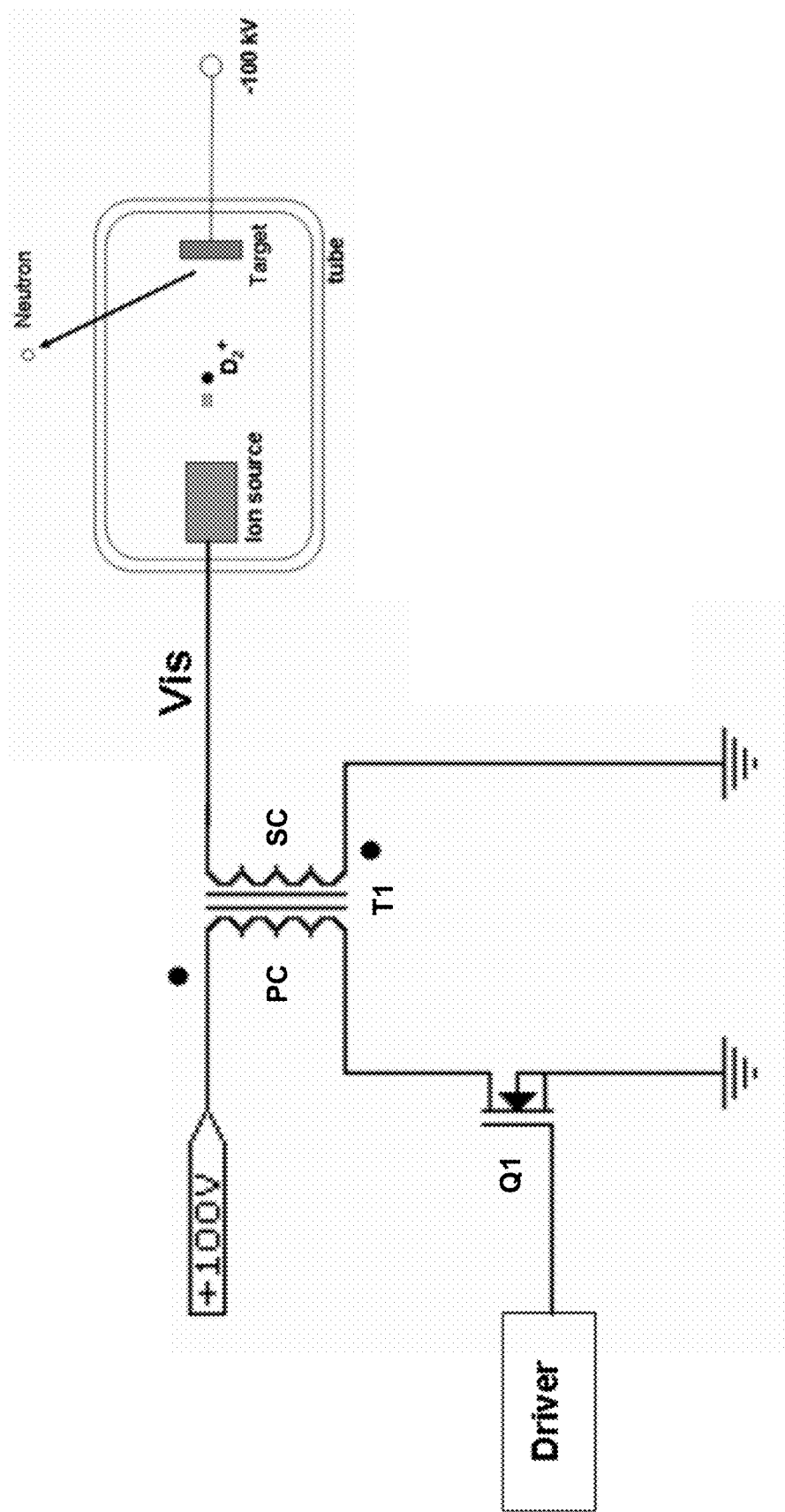
FIG. 3a illustrates a transformer driver for a neutron tube in accordance with an example.
Figure 3B:
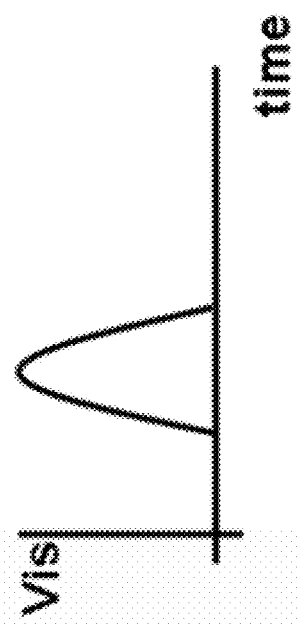
FIG. 3b provides a voltage waveform output by the transformer driver of FIG. 3a in accordance with an example.

To achieve such a waveform, capable of quickly charging the ion source capacitance (approximately 20 pF), a pulse generating transformer is usually employed. One example of a pulse generating transformer is illustrated in FIG. 3a. This device can make a fast rise-time positive pulse that turns the ion source on with an ion source (IS) voltage (Vis). As the output of the transformer T1 falls to zero, the ion source is shut off, resulting in the voltage waveform illustrated in FIG. 3b. The on-off time can be controlled by additional circuitry not shown in this figure for brevity, which can be used to control a driver coupled to the transistor Q1 of FIG. 3a.

The amount of power needed to charge the ion source is directly related to the ion source capacitance. The amount of the ion source capacitance is dependent on the design of the ion source, as well as the length of wiring used to connect the transformer to the ion source. A higher ion source capacitance not only increases the amount of power needed to charge the ion source from each pulse of a pulse generator, but also results in a greater amount of power that will be discharged from the ion source each time the pulse generator is turned off Accordingly, most logging tool designers would place the transformer T1 of FIG. 3a as close as possible to the ion source electrode of the neutron generating tube to minimize any wiring capacitance. As is usually the case, the neutron generating tube is placed in a pressure vessel containing an inert gas, such as sulfur hexafluoride (SF6) to minimize arcing. The feed from the pulse transformer can enter the pressure vessel through a hermetically sealed contact arrangement in proximity with the low voltage end of the neutron generating tube. By strobing the primary coil of the transformer with pulses controlling transistor Q1, energy can be released, that both charges and discharges the ion source electrode turning the neutron fluence on and off. Because the energy to charge the ion source capacitance flows from a current carrying inductor (the transformer secondary coil SC), the power transfer efficiency from magnetic to electric field is Unfortunately, because the high voltage generated by the step-up transformer T1 displays a resonant waveform due to the capacitance it has to drive, it is sinusoidal in nature and cannot display the desired fast rise-time used by modern logging tools. In addition, the period of the pulse is well defined by the inductance of the transformer and capacitance of the ion source and associated wiring. Since these values are fixed, the pulse width is fixed as well and cannot be easily varied. Because of this, it is hard to pulses at different frequencies. For example, if, as mentioned earlier, the repetition rate is set to 10 kHz and the duty cycle is only 10%, the on-time of the neutron tube output pulse is only 10 uS. Such a transformer can be built and tailored for a 2 kV pulse that lasts only 10 uS into the existing capacitance of the ion source. If, however, for logging analysis purposes, another frequency is desired, for detailing other neutron activated emissions, say, 1 kHz, the same pulse transformer would now have to provide a pulse 100 uS long. This can be done by switching in extra capacitance across the primary of the transformer. The waveform can thus be modified but because extra capacitance is being driven, the currents used to achieve the longer pulse time increase rapidly and power transfer efficiencies can suffer. In addition a different capacitor is needed for every different frequency desired. Also, with more capacitance to be driven, the rise and fall times of the pulse will suffer.

Figure 4A:
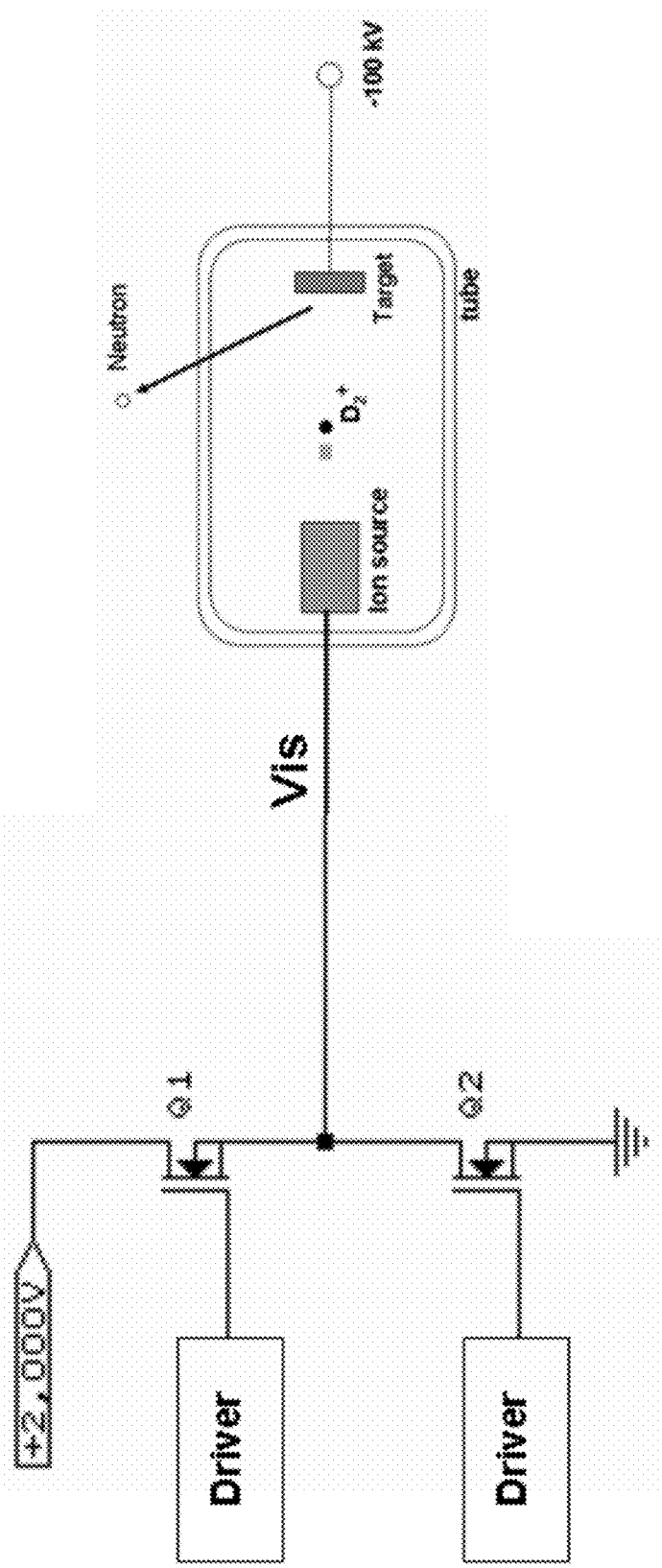
FIG. 4a illustrates a solid state switched driver in accordance with an example.

To circumvent this problem, a solid state transistor switch can be used in a pulse generator to provide the high voltage pulse to a selected device, such as the ion source. One example is illustrated in FIG. 4a. Here, a pass transistor Q1 couple energy from a remote high voltage source (not shown) that is configured to be connected to the pass transistor to charge the ion source when the pulse is to be HIGH (i.e. ON) and another transistor, Q2, referenced to ground is used to discharge the ion source capacitance, shunting the charge to ground when the pulse is to be OFF. Because the transistors are switched on and off, it would seem the power dissipation is miniscule with such a circuit. However, this is not the case when charging a capacitor from a voltage source.

Figure 4B:
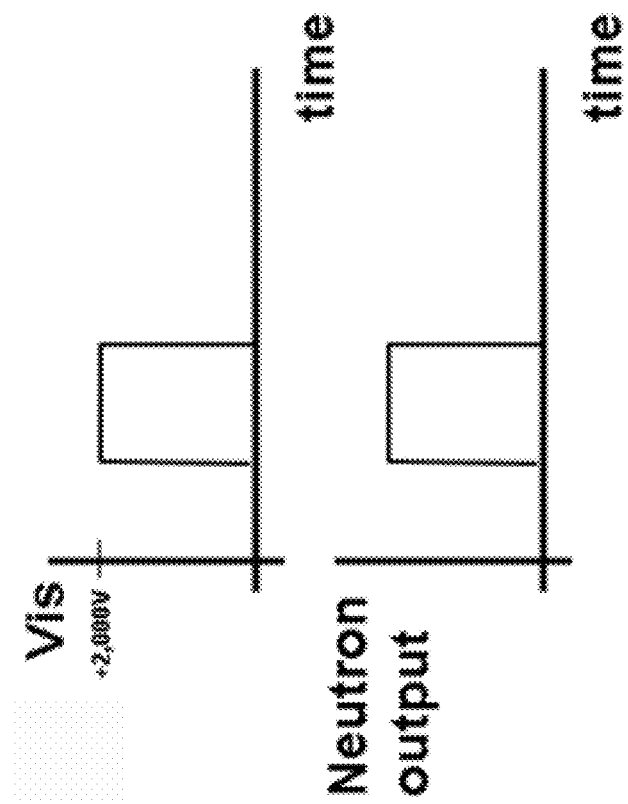
FIG. 4b illustrates a voltage waveform output by the solid state switched driver of FIG. 4a and a corresponding neutron beam output in accordance with an example.

Within the last several years there has been the availability of extremely high voltage metal oxide semiconductor field effect transistors (MOSFETs) with a drain to source voltage (VDS) that is greater than 4,000 volts DC. The high voltage MOSFETs can be utilized in the totem-pole fashion illustrated in FIG. 4a and provide a high voltage pulse that is substantially rectangular with relatively fast rise and fall times. As illustrated in the example of FIG. 4b, the neutron output pulse closely tracks the voltage waveform generated by a totem-pole MOSFET switched power supply.

Unfortunately, elementary circuit analysis shows that when a capacitor is charged from a voltage source, half of the charging energy is wasted as heat in whatever circuit resistance there is in the charging path—no matter what value the series resistance of the circuit displays. For an example, consider the case where a pulsing neutron output is desired of width 10 μS with a repetition frequency of 10 kHz. To achieve this pattern, the ion source is driven with a pulse waveform that charges and discharges the ion source capacitance (a typical value is 20 pF) between 2 kV peak and ground potential at a frequency of 10 kHz. When this ion source capacitance is charged from a voltage source, there is a resistive energy loss that occurs in the transistor supplying the current, Q1, that amounts to:

$$\text{Energy loss } Q1 = \tfrac{1}{2}CV^2 \text{ Joules}$$

This is exactly equal to the energy placed into the capacitance of the ion source as it is charged and raised in potential. Here, C is the ion source capacitance, and V is the voltage that the ion source is charged to. Because this is done 10,000 times per second, the power loss can be tabulated as:

$$\text{Power loss } Q1 = \tfrac{1}{2}fCV^2$$

where f is the frequency. Using the above numerical values as an example to show the magnitude of this effect, we find that this power loss, when the ion source is charged:

$$\text{Charging Power loss} = (0.5)(10,000)(20E^{-12})(4E^6)$$

$$\text{Charging Power Loss} = 0.4 \text{ Watts}$$

Thus, pulsing the ion source at 10 kHz causes a loss of 0.4 Watts which is dissipated as heat in the transistor supplying the current, Q1, the top transistor of FIG. 4a.

When the time comes for the neutron generation to be stopped, the ion source is brought to ground potential. This can be accomplished by turning on Q2. When Q2 is turned on, whatever charge is placed in the ion source capacitance is now drained through the resistance of Q2. The power dissipation of Q2 can be calculated:

$$\text{Power dissipated in } Q2 = \tfrac{1}{2}fCV^2$$

where f is the frequency, C is the ion source capacitance, and V is the ion source voltage. Using again the values listed above, this amounts to:

$$\text{Power dissipated in } Q2 = 0.4 \text{ Watts}$$

Adding the power dissipated provides a total power dissipation of the pulser circuitry of 0.8 Watts. This power is usually dissipated in the semiconductor switches Q1 and Q2, although an external resistor can be used in series with Q2 to dissipate the heat instead of the semiconductor.

Figure 5:
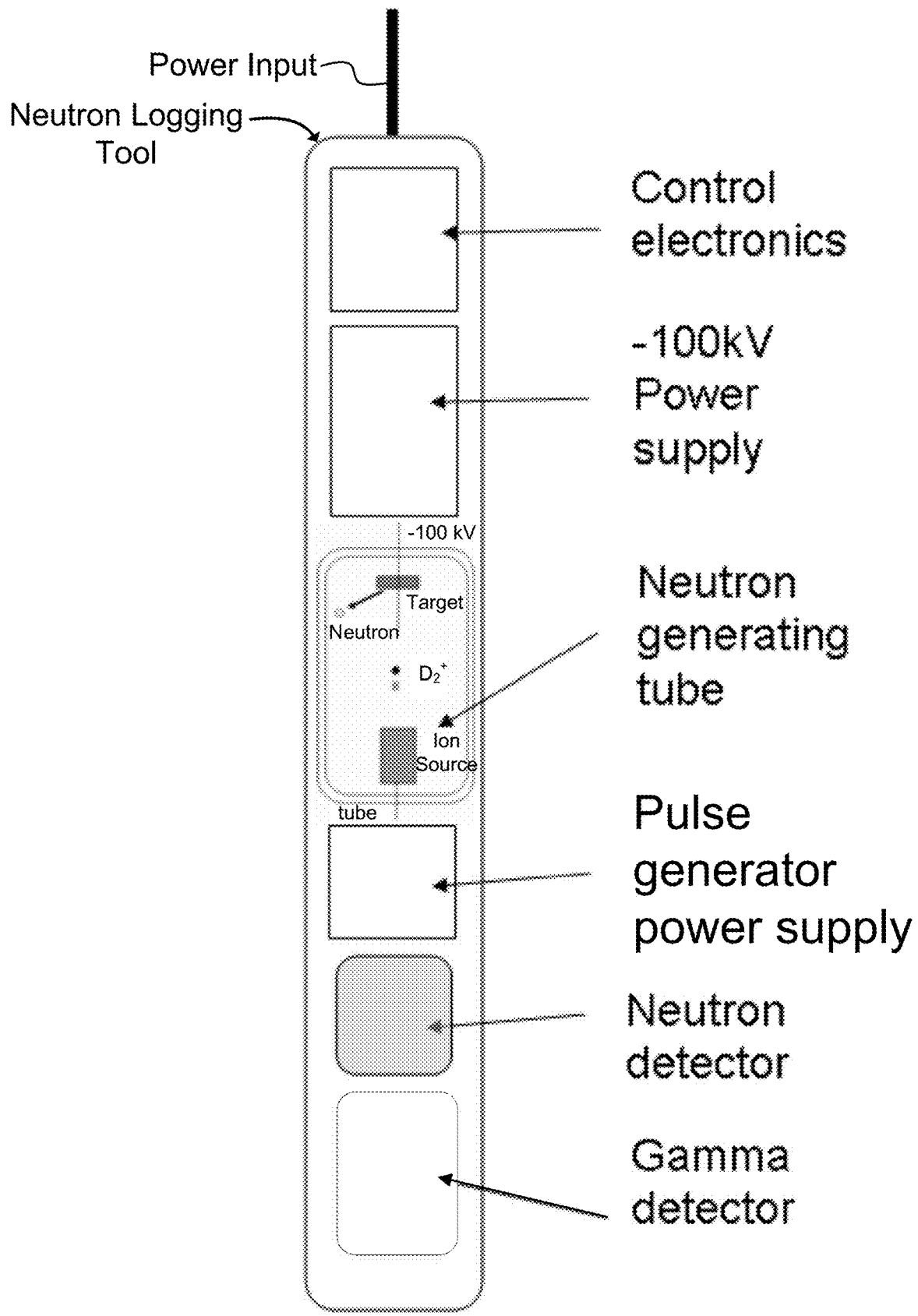
FIG. 5 illustrates a diagram of a neutron logging tool in accordance with an example.

If a circuit, such as the example illustrated in FIG. 4a, is used, the high voltage pulse power supply that powers the transistor totem-pole switch is configured to provide 0.8 Watts, not counting any cross conduction that may be present in the switches nor the intrinsic capacitance of the semiconductor switches themselves. A dissipation of 0.8 Watts is relatively small and can be easily managed with proper heat sinking. In addition, using a solid state transistor allows a continuously variable pulse width from less than 10 uS to DC. Such techniques can be extensively used in logging tools. The use of a semiconductor switch is therefore efficient when the ion source capacitance is limited to values in the tens of picofarads. To keep the ion source capacitance low, the electronic pulser switch is typically placed as close to the neutron generating tube as possible. This mechanical setup is shown in FIG. 5 in an example illustration of a neutron logging tool configuration showing the high voltage pulse generator driving the neutron tube and a neutron detector placement to sense neutron output.

Figure 6:
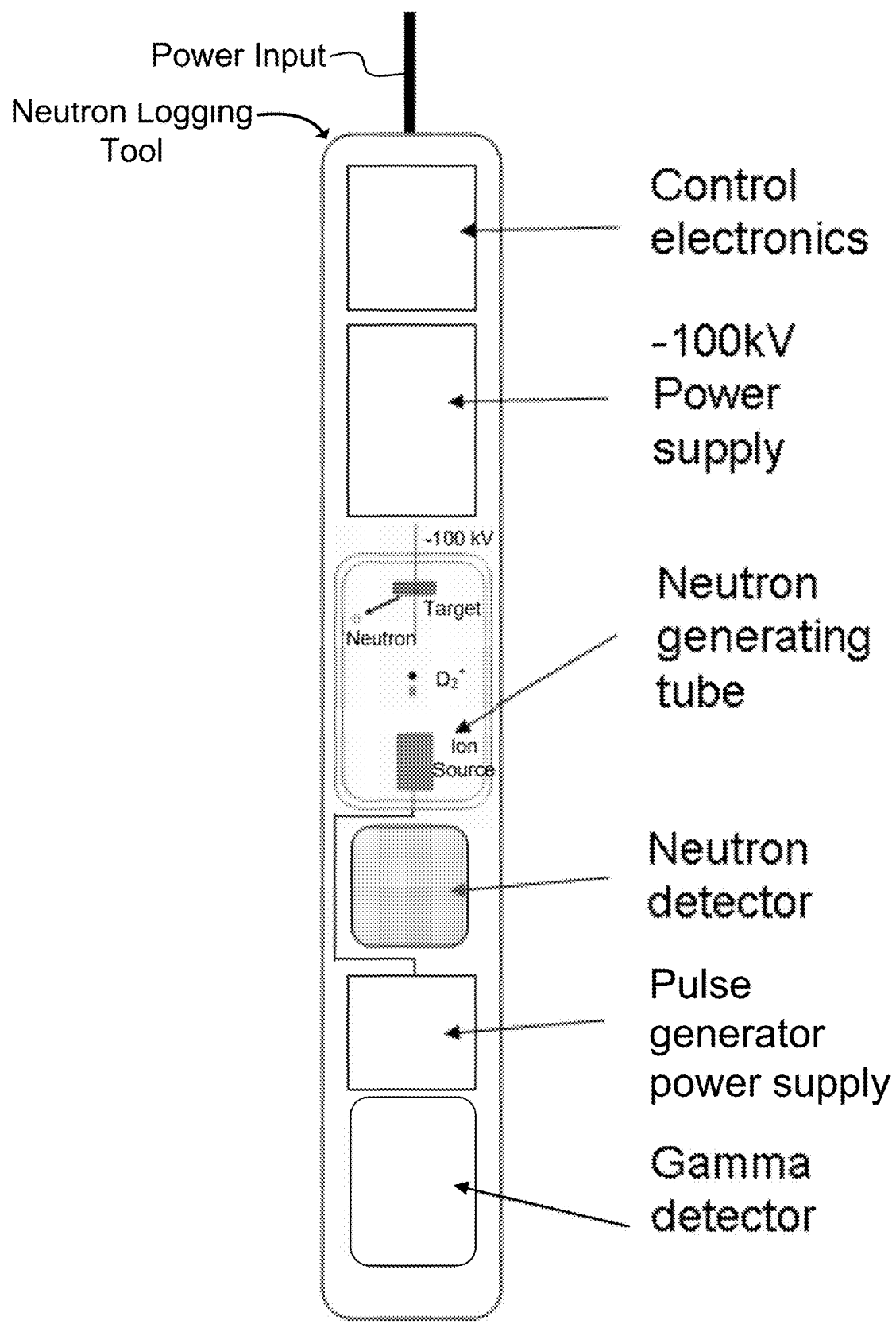
FIG. 6 illustrates a diagram of a neutron logging tool with an improved component placement in accordance with an example.

In neutron logging tools it is important to know the fluence of the neutrons emanating from the neutron tube in order to produce the most correct analysis. Therefore, not only are returning gamma rays monitored with a gamma detector, but the outgoing neutron rate as well. To gauge this parameter, a neutron detector mechanism is typically provided such as a Helium-3 neutron counter, which is placed in the location as shown in FIG. 5. However, as this technology evolves and newer logging tools are designed, it can be advantageous to have the neutron detector placed as close to the neutron generating tube as possible (see FIG. 6). To accommodate the move of the neutron detector to be adjacent to the neutron generating tube, the ion-source pulse generator power supply can be moved away from the neutron generating tube. By mounting a neutron detector directly adjacent to the low voltage end of the neutron generating tube allows one to obtain the highest degree of correctness in neutron count during the logging process. Having a more precise representation of the neutron fluence will yield a log with greater accuracy. In U.S. Pat. No. 9,069,095 B1, Sicco Beekman, et al, details of this importance are noted, stating "the neutron output of a neutron generator may be measured using a fast neutron detector in close proximity to the neutron source" because "neutron output of a generator tube varies strongly with applied high voltage, internal gas pressure, target temperature and age to name a few." Mounting the neutron detectors as close to the neutron generating tube as possible reduces false readings due to "fast neutron signals stemming from neutrons scattered in material surrounding the neutron source or the neutron instrument."

Mounting a neutron detector as close to the neutron generating tube as possible means that the high voltage pulse generator has to be moved further away. However, moving the high voltage pulse generator causes the capacitance that needs to be driven to increase due to longer wiring lengths. Capacitance values can increase from 20 pF to 50 pF or higher, raising the power dissipation of the electronic switch from 0.8 Watts to above 2 Watts. This is an additional source of thermal energy that needs to be transferred to the outside of the logging tool to maintain a temperature within the logging tool that is conducive to the operating of the electronics in the logging tool.

Figure 7:
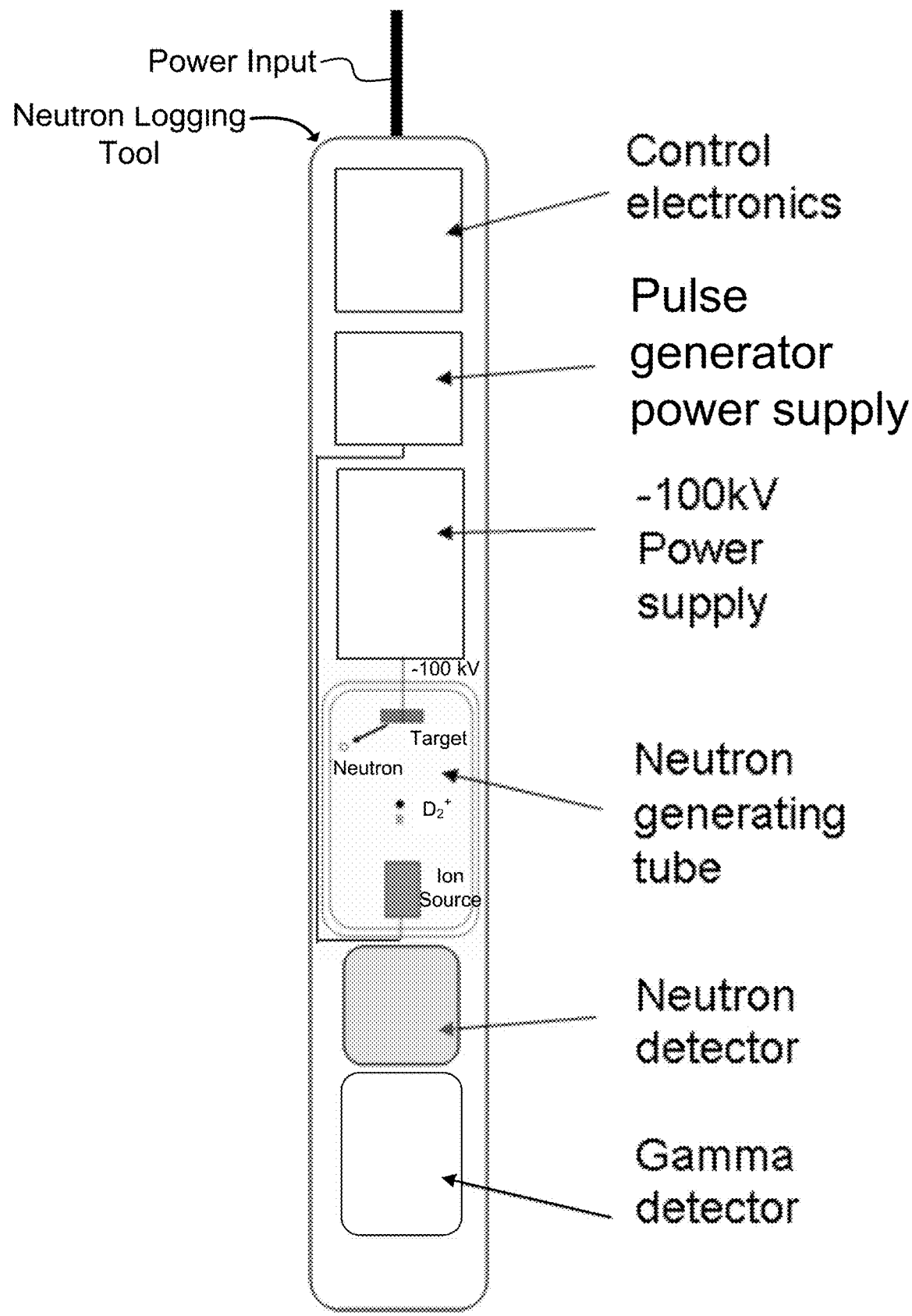
FIG. 7 illustrates a neutron logging tool with a more improved component placement in accordance with an example.

Still further improvements to a neutron logging tool may be made by placing the ion source high voltage pulse generator in an entirely different location and moving it away from the neutron detector region. In one embodiment, placement of the high voltage pulse generator closer to the base of the logging tool, where the input power enters the tool itself, can provide advantages relative to the placement in FIG. 6. This location, shown in FIG. 7, can provide significant reduction in electrical noise from entering the sensitive detectors (either neutron or gamma) because the power feed to the high voltage pulse generator does not have to run along the radiation detector region, thereby minimizing false counts caused by electrical noise from the power feed.

The high voltage pulse generator can include a controller, a digital signal processor, or another type of digital processor configured to send digital control signals to the high voltage pulse generator to instruct the high voltage pulse generator when to turn the pulses on and off. A control line from the control electronics to the high voltage pulse generator can be located so that the control line does not have to travel along the pressure vessel of the neutron generating tube, thereby reducing false triggering of the high voltage pulse generator due to noise pickup in the digital control signals that are sent to the high voltage pulse generator in the control line.

Another benefit of moving the high voltage pulse generator to the input power end of the neutron logging tool is a better ability to control the power dissipation of the high voltage pulse generator. The energy that flows out of the high voltage pulse generator is typically converted to heat. The high voltage pulse generator is now relocated to a region of the neutron logging tool that is farther from the neutron generating tube and its associated radiation sensors, thereby reducing the temperature increase of this region. A few degrees rise in temperature of a neutron generating tube or neutron/gamma detectors can seriously affect accurate neutron production or counts. Lastly, the wire count to drive the high voltage pulse generator that passes along the pressure vessel of the neutron generating tube can be reduced with only one high voltage wire set that is used to bring the pulsed voltage to the ion source in the neutron generating tube.

Although placing the high voltage pulse generator far away from the neutron generating tube can yield superior data results for reasons mentioned above when compared with other architectures, this placement will cause large increases in the capacitance that must be driven, due to longer wire lengths between the high voltage pulse generator and the neutron tube ion source. Placing the high voltage pulse generator closer to the power input end of the logging tool can raise the total capacitance to values above 200 pF. The increase in the capacitance can make such a system impractical if an electronic semiconductor switch is being used to form the pulse. If such a semiconductor switch is used, the power dissipation in the high voltage pulse generator can be well over 8 Watts, using the calculations from our previous example. It is not an easy task to remove this amount of power in order to keep the temperature in the high voltage pulse generator, or other electronics in the neutron logging tool, from rising above the limiting temperature of the semiconductors. As a quick example, most neutron logging tool designs would like to utilize as small a volume as possible for the high voltage pulse generator and if the semiconductor pulser solid state switch is 4 inches long and 1.25 inches in diameter, a temperature rise of over 45 degrees may be seen in the outer surface of such a package when dissipating 8 Watts into a typical tool housing. This raises the transistor junction temperatures well above 220° Celsius when operating at an ambient of 175 degrees. At this temperature most semiconductors will leak current excessively and not function properly.

Accordingly, embodiments of an improved high voltage pulse generator are described. In one embodiment, the improved high voltage pulse generator can be used to drive a device, such as an ion source in a neutron generating tube in a neutron logging tools. This example is not intended to be limiting. The improved high voltage pulse generator can also be used to drive other types of ion sources, a control for a microwave tube, a control for an x-ray tube, semiconductor processing equipment, a laser, a semiconductor laser, or other high voltage elements.

In one example of the improved high voltage pulse generator, the following parameters can be realized:
1. The pulse drive circuitry can source and sink high voltage and charge and discharge the device capacitance, such as the neutron tube ion source capacitance, as well as the distributed wiring capacitance, regardless of its value, within 1 microsecond (uS), to voltages up to or exceeding +2000 Volts.
2. Circuitry can have variable ON-time from 10 uS to direct current (DC).
3. Circuitry can charge and discharge all capacitance efficiently, without producing sufficient heat that it affects the operation of the circuitry or circuitry in the device.

Because such well logging tools may operate at elevated temperatures, it is important that the topology selected offers as high energy transmission efficiency as possible. This is important where operating environments as high as 175 degrees Celsius or higher may be encountered. In addition, high efficiency is important because there is a limit to the amount of power available to operate electronic circuitry in wireline or Measurement While Drilling (MWD) systems, realizing that the only source of power is fed through a cable that may be several miles long or produced by downhole generators.

In accordance with one embodiment of the invention, the improved high voltage pulse generator can include a flyback topology that can be utilized to charge a capacitor (i.e. system capacitance) with a reduced amount of power loss. For example, in the topology illustrated in the example of FIG. 8a, energy is stored in the magnetic field of a step-up transformer (T1) and released as a flow of charge through a diode (D1) charging up the load. In this example, the load is comprised of the system capacitance that includes the capacitance of the wiring, the capacitance of the ion source, and stray capacitance, as previously discussed. The flow of charge through the diode D1, referred to as flyback energy, forms the rising pulse to operate the ion source of the neutron generator tube charging up the complete system capacitance that may include the wiring capacitance as well as the stray capacitance. With the advent of new semiconductor materials, very high frequency transistors may now be incorporated in DC to DC converters, operating at frequencies into the 10 Megahertz (MHz) range and higher. By constructing the transformer with a clamp winding (not shown), the output voltage pulse height is a function of the input voltage, Vapplied (Va). Va is +100V in the example of FIG. 8a.

As the transistor Q1 switches on, a voltage is applied to the primary coil (PC) of the transformer (T1). As previously discussed, when Q1 is switched off, the energy in the primary coil (PC) is transferred from the primary coil (PC) to the secondary coil (SC), forming a flow of charges in the secondary coil (SC). This charge then flows from the secondary coil (SC) through the diode (D1) to the ion source, charging the system capacitance. It can be seen, in FIG. 8, even though the transformer voltage at the secondary coil (SC) drops off after it transfers energy to charge the ion source, the in-line diode D1 prevents (blocks) this effect from lowering the voltage of the system capacitance in the wiring and ion source of the neutron tube. Accordingly, the voltage of the system capacitance continues to rise with each cycle of Q1 until the voltage reaches the voltage of the secondary coil Vp. This is illustrated in FIG. 8b with the stepped increase in ion source voltage on the rising edge of the pulse.

As an example, if the transformer is operated in the flyback mode at an operating frequency of 10 MHz, a rectified output of 2 kilovolts (kV) Vp with a rise time of less than 1 uS may be achieved when driving a system capacitance of 250 pF or more, if the proper primary inductance is selected for the flyback transformer. This also depends upon the input voltage operating the high voltage pulse generator, the output pulse height that is desired, the operating frequency of the converter, and the capacitance of the system that is to be driven. Inductance values of between 0.1 micro Henry ($\mu$H) and 2 $\mu$H have been examined and for the specifications that are desired, a selection of components can be made.

In one example, the primary inductance for the transformer can be a value of 1 uH. Because the energy placed in the primary coil of the transformer is eventually released into the system capacitance through a diode, the voltage rise time seen at the Vp will approximate a step function since the converter is operating at a frequency of 10 MHz, where the rise time of 1 uS can be supplied by ten cycles of energy from the transformer. Such operational frequencies are easily realized with selected types of transistors. For example, gallium nitride cascode field effect transistors (FETs) or silicon carbide devices can be utilized at the selected frequencies.

Figure 8A:
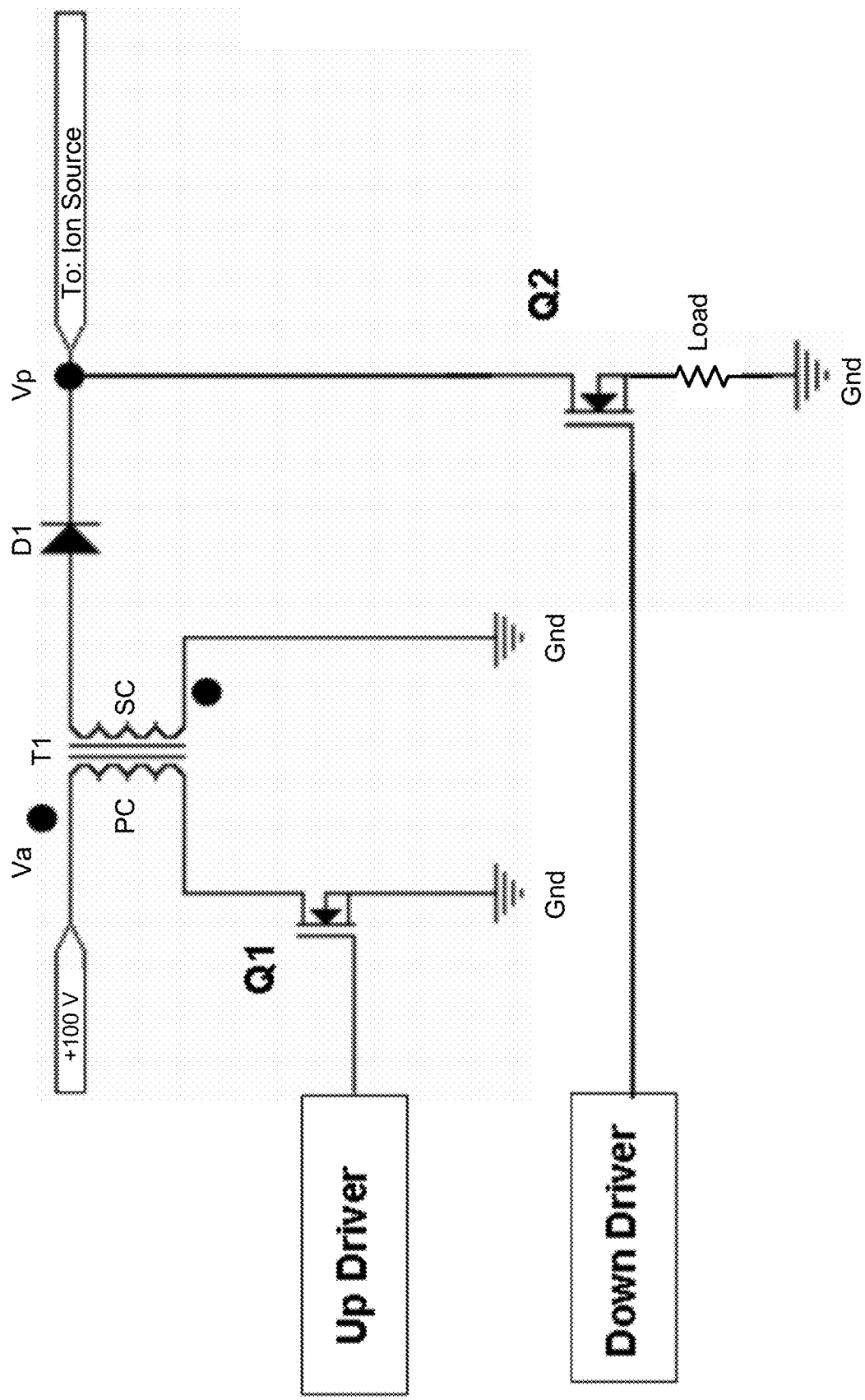
FIG. 8a illustrates a pulsed driver with a flyback topology in accordance with an example.
Figure 8B:
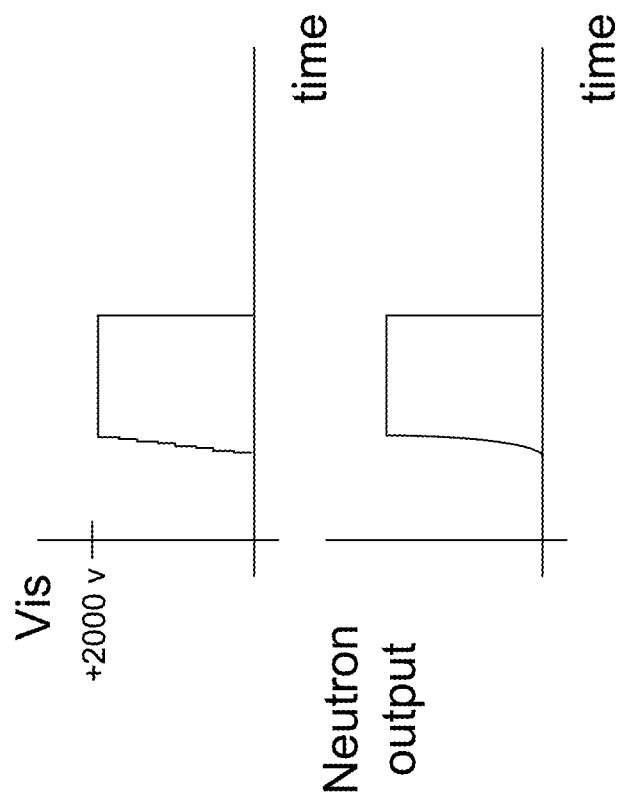
FIG. 8b illustrates a voltage waveform output by the solid state switched driver of FIG. 8a with a stepped rising edge and a corresponding neutron beam output in accordance with an example.

In the example of FIG. 8a, the energy is directed from the transformer directly into the ion source and wiring capacitance, achieving a nearly 100% transfer efficiency, as compared to a solid state switch, which has a maximum efficiency of 50%, as previously discussed. Because the flyback topology works by sending a burst of energy packets from the magnetically stored energy of the transformer into the system capacitance (ion source and associated wiring) at a frequency of operation in this example of 10 MHz, the amount of "on time" of the resulting pulse voltage placed on the ion source is variable from approximately a few microseconds to continuously on (DC). Because the ion source accelerates the deuterium ions out of its structure, there is always a need for current flowing from the high voltage pulse generator even after the ion source capacitance is charged. This can be easily supplied and regulated by the drive circuitry.

In FIG. 3a, the ion source is charged with one burst of energy that flows out of the transformer T1. The resulting waveform applied to the ion source is one ring-up of a resonant waveform to charge the system capacitance. When the transformer in FIG. 3a transfers the energy from the secondary coil of the transformer to the ion source, the voltage drops and the ion source shuts off. The width of the "ON" time of the pulse is not adjustable, it is a property of the transformer inductance. A pulse with a longer "ON" time cannot be formed without changing the value of the components in the circuit. The circuit of FIG. 3a cannot operate in a continuous, DC ON mode.

In contrast, in FIG. 8a, as long as the switching transistor Q1 continues to charge the primary coil (PC) of the transformer T1, a voltage Vp will be maintained at the ion source that does not drop off by virtue of the in line diode D1. Thus, with the topology of FIG. 8a, an "ON" pulse voltage can be provided to the ion source for substantially any desired time period, from a few microseconds (i.e. 2 microseconds), to continuously on.

In accordance with the first embodiment of the invention, a high voltage pulse generator is disclosed that comprises a pulse generating transformer T1 having a primary coil (PC) with a first side and a second side, and a secondary coil (SC) with a first side and a second side. The high voltage pulse generator further includes a direct current (DC) voltage source connection at the first side of the primary coil. The DC voltage source connection is configured to be connected to a DC power supply to provide a selected voltage to the first side of the primary coil.

The high voltage pulse generator further includes a first high frequency power driver transistor Q1 coupled between the second side of the primary coil and a ground connection. The first high frequency power driver transistor Q1 is configured to operate in an on-mode for a selected time period. The on-mode is determined by the switching frequency at which Q1 is configured to operate. In one example, Q1 can be configured to operate configured to operate at a frequency between 100 Kilohertz (KHz) and 50 MHz. When Q1 operates in the on-mode, it can charge the primary coil of T1 for the selected time period based on the switching frequency of Q1. When Q1 switches to an off-mode, the charge of the primary coil is released from the primary coil to the secondary coil of T1.

The high voltage pulse generator further includes a diode D1 coupled between the first side of the secondary coil and a pulsed voltage output that is configured to be connected to a high voltage device. The diode is configured to direct a current from the charge in the secondary coil that flows to charge a capacitance of the high voltage device. As used herein, the capacitance is considered to be a system capacitance that includes the capacitance of the high voltage device (i.e. an ion source), the wiring connected between D1 and the high voltage device, and any stray capacitance in the system. The increase in charge of the capacitance due to the charge flowing from the secondary coil flowing as current results in an increase in a voltage of a leading edge of a voltage pulse.

The voltage pulse will continue to rise during each on-mode of Q1 until the voltage pulse is a selected integer ratio greater than the selected voltage at the first side of the primary coil. The selected integer ratio is determined by a ratio of a number of turns in the primary coil relative to a number of turns in the secondary coil. In the example of FIG. 8a, the selected voltage is +100 V. If the number of turns in the secondary coil is 20 times greater than the number of turns in the primary coil, then the voltage pulse will be approximately +2,000 V. The ratio of the number of turns in the secondary coil relative to the number of turns in the primary coil can be determined based on the desired Va and Vp values.

The high voltage pulse generator can further comprise a discharge transistor Q2 coupled between the second side of the secondary coil of T1 and the ground connection. Q2 is configured to discharge the capacitance of the high voltage device to the ground connection to form a trailing edge of the voltage pulse.

In one example, the voltage pulse can rise from a value of approximately 0 volts to a value of approximately Vp volts in a selected number of cycles of Q1 as the capacitance of the high voltage device and wiring is charged. For instance, the voltage pulse may reach the value of Vp after 10 cycles of Q1. If Q1 operates at a frequency of 10 MHz, then the rise time of the voltage pulse is approximately 10 microseconds.

After reaching Vp, the voltage pulse can be maintained for a selected period of time until Q2 is activated by a down driver to direct the charge in the capacitance of the high voltage device to ground and reduce the voltage in the voltage pulse to a predetermined level. The predetermined level may be a second selected voltage level. Alternatively, the charge can be directed to ground until the voltage is at approximately ground (0 V) to turn the voltage pulse off The voltage pulse can be reduced or directed to ground at any time period after the rise time of the voltage pulse (i.e. after the voltage pulse is approximately equal to Vp). Accordingly, the voltage pulse can have a time period in this example from 10 microseconds (the rise time) to an indefinite period. The down driver can be configured such that each voltage pulse will have the same length. Alternatively, each voltage pulse can have a predetermined time period.

The energy from the capacitance can be directed to the ground. Alternatively, a load, such as a resistor, can be coupled between Q2 and the ground. The load can act as a heat sink and dissipate the energy in the capacitance of the high voltage device as heat, instead of in the semiconductor Q2.

Figure 9:
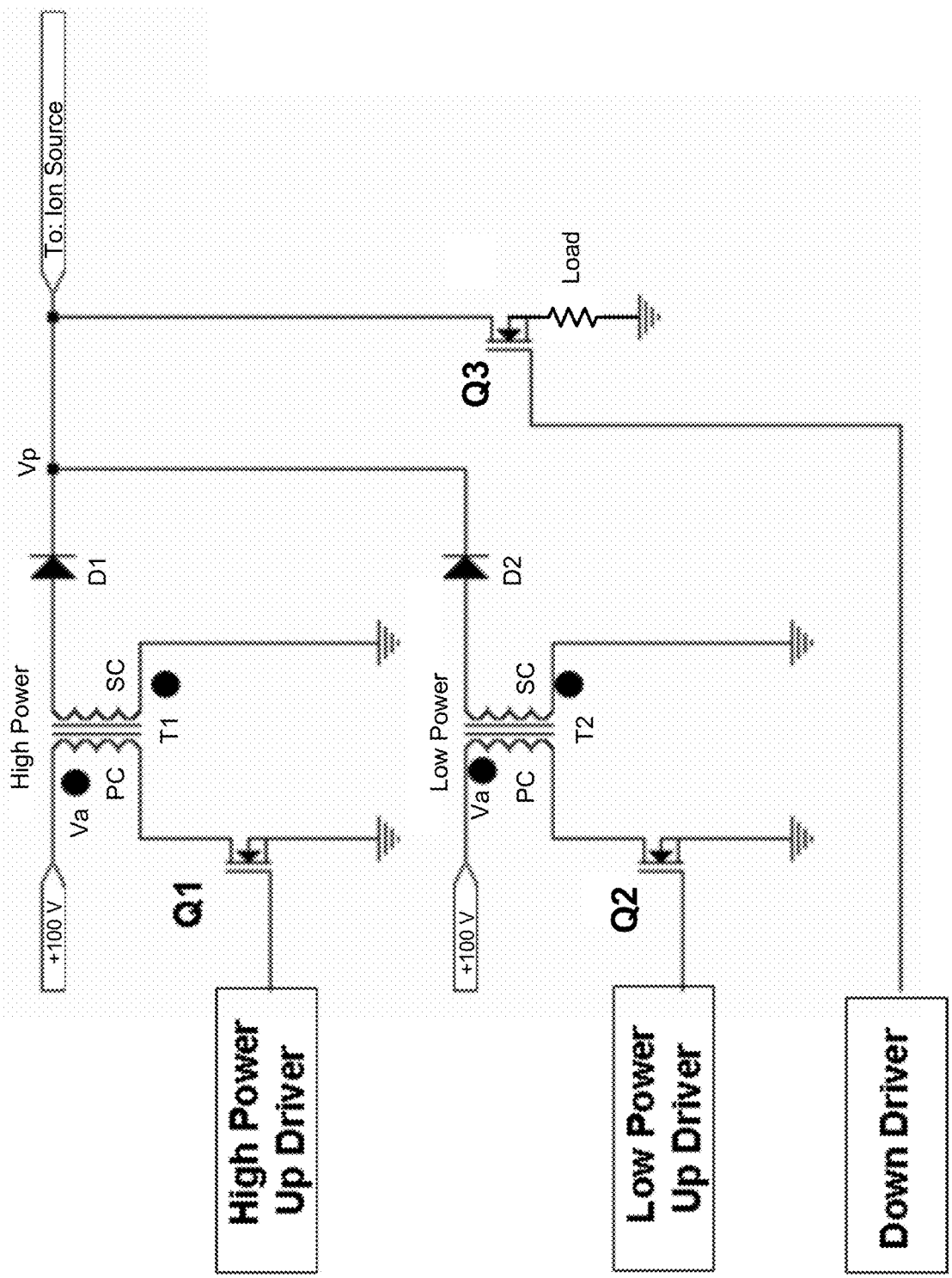
FIG. 9 illustrates a pulsed driver with flyback topology with separate high power and low power drivers in accordance with an example.

A second embodiment of the invention is related to maximizing the efficiency of the high voltage pulse generator and deals with having two (or more) transformer circuits running in parallel (FIG. 9). As used herein, the term transformer circuit refers to a circuit that converts one voltage (i.e. the same voltage) to another voltage, while maintaining that voltage with the use of a diode. In FIG. 9, one transformer circuit, designed for high power, is configured to produce a high voltage output with a relatively fast rise time used at the beginning of the pulse, and a second transformer circuit, designed for lower power, is configured to maintain the voltage level of the pulse once the system capacitance is fully charged. By tailoring the different transformer circuits to perform different jobs, a higher system efficiency can be obtained relative to using just a single transformer.

In order to charge a relatively large capacitance rapidly, a high power transformer circuit comprises transformer T1 that is designed to process a high level of power. For example, to charge a 200 pF capacitor to 2 kV, within 1 uS, the high power transformer circuit uses circuitry having a power capability of 40 Watts. However, the high power capability is only needed during the first 1 uS for the voltage on the system capacitance to rise. The high power capability is not needed once the pulse voltage Vp has been established and the system capacitance is substantially fully charged such that the system capacitance voltage is substantially equal to the pulse voltage Vp. In this example, after a Vp of 2 kV has been achieved (i.e. the system capacitance is fully charged), the typical power supplied by the high voltage pulse generator is usually less than one Watt. After the system capacitance has been charged, a much smaller current from the high voltage pulse generator is used by a high voltage device. For example, the ion source uses a smaller voltage after being fully charged to push the flowing charges of the ion beam forward, with some power going to leakage, especially at high operating temperatures.

This steady state "topping off" power, can be easily taken care of by the second, lower power transformer circuit, comprising transformer T2 that is configured to run in parallel with the higher power transformer circuit. It is important to realize that because flyback converters show their peak efficiency at one power level, a 40 Watt converter optimized to have the highest efficiency at full power will not show a high efficiency working at a substantially lower power, such as one Watt. Likewise, a lower power converter designed to have its maximum efficiency at five Watts or less will show much less efficiency at a much higher power, such as 40 Watts (if it can perform at that power level at all).

In one embodiment of the invention, when a high voltage output pulse is produced, both of the high and low power transformer circuits can be switched on using a high power up driver to control the transistor Q1 and a low power up driver to control the transistor Q2. However, to conserve energy, the high power transformer circuit may only be switched on for enough time, such as for 2 uS, to provide the sudden rise in voltage to define the pulse and charge the system capacitance. The high power transformer circuit can then be switched off to save energy after the system capacitance has been substantially fully charged. The lower power transformer circuit can be configured to keep operating, thereby maintaining the high voltage potential of the pulse. The low power up driver can switch Q2 to maintain the high voltage potential of the pulse for a selected pulse width. The pulse width can be fixed or variable, based on the needs of the system. A down driver can be used to turn on the transistor Q3 to drain the system capacitance to ground and reduce the pulse voltage to substantially 0 volts, or a desired voltage level. Q3 can be coupled to ground. Alternatively, Q3 can be coupled to a load to absorb the energy of the system capacitance and convert it to heat that can be dissipated.

Although in this example embodiment, two transformer circuits are used instead of one, this technique actually saves energy because the magnetizing current of the low power circuit's transformer can be reduced substantially by increasing the primary inductance. This results in less dissipation in the resistive components of the transistor, Q2. In addition, valuable room can be saved as well because the duty cycle of the high power transistor circuit is typically limited only to the rise in pulse voltage, a few microseconds, and thus may be made using smaller components. The transistor Q1 and the transistor Q2 can be configured to operate at the same or a similar frequency, but it is not a necessity. A typical operating frequency can be from 100 kHz to 50 MHz. When the two transistors are operated at the same frequency, it can simplify the circuit by minimizing effects that occur when different frequencies are used, such as the potential for frequency beats to occur in the circuit. The Q3 transistor may be operated at a different frequency than Q1 and Q2. The Q3 transistor can be selected to operate at a frequency based on the desired power "on" and "off" time of the voltage pulse. In one embodiment, the Q3 transistor can be selected to operate at the same frequency as Q1 and Q2 for simplicity of design in the circuit.

In accordance with another embodiment of the invention, the high voltage pulse generator, as previously described, can further comprise a low power transformer Tw having: a primary coil PC with a first side and a second side; and a secondary coil SC with a first side and a second side. The first side of the primary coil of the low power transformer T2 is configured to be coupled to the DC voltage source. A low power transistor Q2 is coupled between the second side of the primary coil of the low power transformer T2 and the ground connection. The low power transistor Q2 is configured to operate in an on-mode for a second selected time period to charge the primary coil of the low power transformer T2 for the second selected time period based on a switching frequency of the low power transistor Q2, and switch the low power transistor Q2 to an off-mode at the switching frequency to release the charge from the primary coil of the low power transformer T2 to the secondary coil of the low power transformer T2. A low power diode D2 is coupled between the first side of the secondary coil of the low power transformer T2 and the pulsed voltage output that is configured to be connected to a high voltage device, such as the ion source. The low power diode D2 is configured to direct current from the secondary coil of the low power transformer T2 to the high voltage device to maintain a charge on the capacitance of the high voltage device.

While the term "low power" is used with respect to the transistor Q2 and diode D2, it is intended to be descriptive of the portion of the high voltage pulse generator that the components are located in. The same transistor and diode may be used for Q1 and Q2 and D1 and D2. However, the high power transformer T1 and low power transformer T2 are designed differently to operate at different power levels, as previously discussed.

Once the high power device, such as the ion source, and associated capacitances that comprise the system capacitance are charged, the ion source can then be discharged when the time comes for the neutron pulse to be turned off. To achieve a fast fall time, in accordance with an embodiment of the invention, a solid state switch can be used as shown by adding Q2 in FIG. 8a or Q3 in FIG. 9. The solid state switch in FIG. 9 can be a discharge transistor Q3 that is coupled between the second side of the secondary coil of the low power transformer T2 and the ground connection. The discharge transistor configured to discharge the capacitance of the high voltage device to the ground connection to form a trailing edge of the voltage pulse. A load can be coupled between the discharge transistor Q3 and the ground connection. As previously discussed, the load is configured to dissipate energy from the capacitance.

Figure 10:
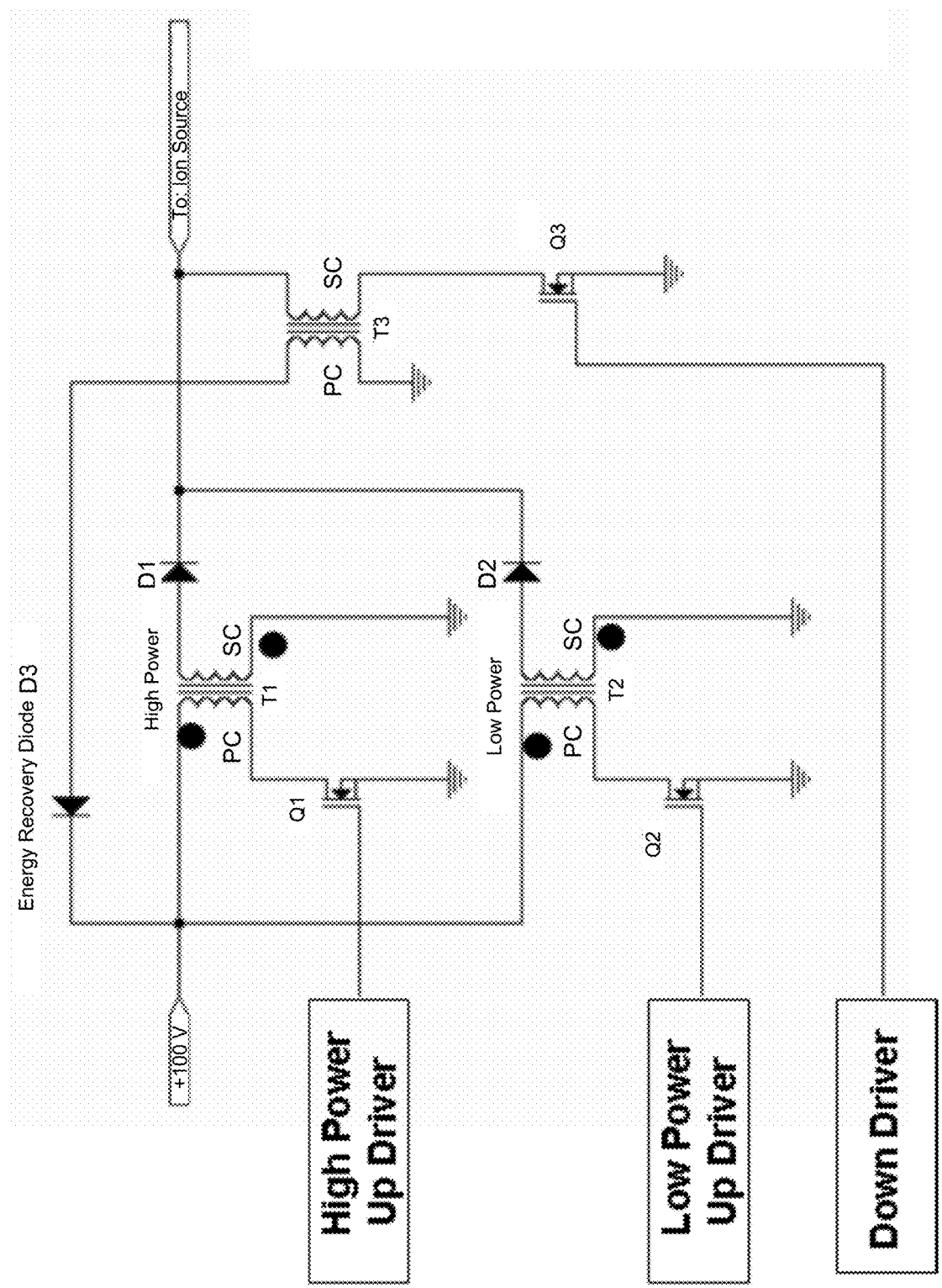
FIG. 10 illustrates a pulsed driver with flyback topology with stored energy recovery in accordance with an example.

However, to save power, the energy of the charged capacitor and system capacitance can be recovered and fed back an input power line connected to between a power supply and the . For example, to discharge a 200 pF capacitor charged to 2,000 volts at a repetition rate of 10 KHz, 4 Watts of power can be dissipated in a switch transistor, such as Q3, and/or a load coupled to Q3. Instead of dissipating the energy as heat, in this embodiment of the present invention, a mechanism is provided to recover this energy that would normally be given off as wasted heat, as illustrated in FIG. 10. A stepdown transformer T3 can be used to magnetically couple the stored energy from the high voltage device, such as the system capacitance of the ion source and associated wiring, back to the input power line that is used to drive the high voltage pulse generator. It is assumed that the input power line has properly configured bypass capacitors. A significant portion of the energy stored in the system capacitance can be recovered, thereby lowering the input current to the high voltage pulse generator. A discharge transistor Q3 can be coupled to a stepdown transformer T3 that is used to transfer the energy from the system capacitance back to the power supply and the inputs to the high power and low power transformers. The discharge transistor Q3 can be selected based on the energy that is to be dissipated from the system capacitance, as well as the desired pulse "on" and "off" time for the high voltage pulse generator. Shorter pulse "on" times will use a transistor with a higher operating frequency. It has been found that in practice, using this energy recovery technique, over 50% of the energy that would normally be dissipated as heat can be recovered. This not only reduces heat generation but also lowers input current to the entire pulser system as well.

In accordance with one embodiment, the high voltage pulse generator can further comprise an energy recovery transformer T3 having a primary coil PC with a first side and a second side, and a secondary coil SC with a first side and a second side. An energy recovery diode D3 is coupled between the DC voltage source and the first side of the primary coil of the energy recovery transformer T3. The energy recovery diode D3 is configured to direct current from a discharge of the capacitance of the high voltage device (i.e. the system capacitance) to a DC voltage source for which the DC voltage source connection is configured to be coupled. The second side of the primary coil of the energy recovery transformer T3 is coupled to the ground connection. The first side of the secondary coil of the energy recovery transformer T3 is configured to be coupled to the high voltage device. An energy recovery transistor Q3 is coupled between the ground connection and the second side of the secondary coil of the energy recovery transformer T3 to release a charge of the primary coil of the energy recovery transformer T3 to the secondary coil of the energy recovery transformer. The energy recovery transformer T3 and associated components can be used in a high voltage pulse generator with a single transformer, as illustrated in FIG. 8a, or with multiple transformers, as illustrated in FIG. 9.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention.

The invention claimed is:

1. A high voltage pulse generator, comprising:
a pulse generating transformer having:
a primary coil with a first side and a second side; and
a secondary coil with a first side and a second side;
a direct current (DC) voltage source connection at the first side of the primary coil, wherein the DC voltage source connection is configured to be connected to a DC power supply to provide a selected voltage to the high voltage pulse generator;
a first high frequency power driver transistor coupled between the second side of the primary coil and a ground connection, the first high frequency power driver transistor configured to operate in an on-mode for a selected time period to charge the primary coil for the selected time period based on a switching frequency of the first high frequency power driver transistor, and switch the first high frequency power driver transistor to an off-mode at the switching frequency to release the charge from the primary coil to the secondary coil;
a diode coupled between the first side of the secondary coil and a pulsed voltage output that is configured to be connected to a high voltage device, the diode configured to direct a current from the secondary coil to charge a capacitance of the high voltage device to form a leading edge of a voltage pulse;
a low power transformer having:
a primary coil with a first side and a second side; and
a secondary coil with a first side and a second side;
the first side of the primary coil of the low power transformer configured to be coupled to the DC voltage source;
a low power transistor coupled between the second side of the primary coil of the low power transformer and the ground connection, the low power transistor configured to operate in an on-mode for a second selected time period to charge the primary coil of the low power transformer for the second selected time period based on a switching frequency of the low power transistor, and switch the low power transistor to an off-mode at the switching frequency to release the charge from the primary coil of the low power transformer to the secondary coil of the low power transformer; and
a low power diode coupled between the first side of the secondary coil of the low power transformer and the pulsed voltage output that is configured to be connected to the high voltage device, wherein the low power diode is configured to direct current from the secondary coil of the low power transformer to the high voltage device to maintain a charge on the capacitance of the high voltage device; and
an energy recovery transformer having:
a primary coil with a first side and a second side; and
a secondary coil with a first side and a second side;
an energy recovery diode coupled between the DC voltage source and the first side of the secondary coil of the energy recovery transformer, wherein the energy recovery diode is configured to direct current from a discharge of the capacitance of the high voltage device to the DC voltage source;
the second side of the secondary coil of the energy recovery transformer is coupled to the ground connection;
the first side of the primary coil of the energy recovery transformer is configured to be coupled to the high voltage device; and
an energy recovery transistor coupled between the ground connection and the second side of the primary coil of the energy recovery transformer to release a charge of the primary coil of the energy recovery transformer to the secondary coil of the energy recovery transformer when a voltage is applied from a driver to the energy recovery transistor.

2. The high voltage pulse generator of claim 1, wherein the first high frequency power driver transistor is configured to operate at a frequency between 100 Kilohertz (KHz) and 50 MHz.

3. A high voltage pulse generator, comprising:
a pulse generating transformer having:
a primary coil with a first side and a second side; and
a secondary coil with a first side and a second side;
a direct current (DC) voltage source connection at the first side of the primary coil, wherein the DC voltage source connection is configured to be connected to a DC power supply to provide a selected voltage to the high voltage pulse generator;
a first high frequency power driver transistor coupled between the second side of the primary coil and a ground connection, the first high frequency power driver transistor configured to operate in an on-mode for a selected time period to charge the primary coil for the selected time period based on a switching frequency of the first high frequency power driver transistor, and switch the first high frequency power driver transistor to an off-mode at the switching frequency to release the charge from the primary coil to the secondary coil;
a diode coupled between the first side of the secondary coil and a pulsed voltage output that is configured to be connected to a high voltage device, the diode configured to direct a current from the secondary coil to charge a capacitance of the high voltage device to form a leading edge of a voltage pulse;
a low power transformer having:
a primary coil with a first side and a second side; and
a secondary coil with a first side and a second side;
the first side of the primary coil of the low power transformer configured to be coupled to the DC voltage source;
a low power transistor coupled between the second side of the primary coil of the low power transformer and the ground connection, the low power transistor configured to operate in an on-mode for a second selected time period to charge the primary coil of the low power transformer for the second selected time period based on a switching frequency of the low power transistor, and switch the low power transistor to an off-mode at the switching frequency to release the charge from the primary coil of the low power transformer to the secondary coil of the low power transformer;
a low power diode coupled between the first side of the secondary coil of the low power transformer and the pulsed voltage output that is configured to be connected to the high voltage device, wherein the low power diode is configured to direct current from the secondary coil of the low power transformer to the high voltage device to maintain a charge on the capacitance of the high voltage device; and a discharge transistor coupled between the high voltage device and the ground connection, the discharge transistor configured to discharge the capacitance of the high voltage device to the ground connection, when a voltage is applied from a driver to the discharge transistor, to form a trailing edge of the voltage pulse.

4. The high voltage pulse generator of claim 3, wherein the first high frequency power driver transistor is configured to operate at a frequency between 100 Kilohertz (KHz) and 50 MHz.

5. The high voltage pulse generator of claim 3, further comprising a load coupled between the discharge transistor and the ground connection, the load configured to dissipate energy from the capacitance of the high voltage device.

6. The high voltage pulse generator of claim 3, further comprising:
an energy recovery transformer having:
a primary coil with a first side and a second side; and
a secondary coil with a first side and a second side;
an energy recovery diode coupled between the DC voltage source and the first side of the secondary coil of the energy recovery transformer, wherein the energy recovery diode is configured to direct current from a discharge of the capacitance of the high voltage device to the DC voltage source;
the second side of the secondary coil of the energy recovery transformer is coupled to the ground connection;
the first side of the primary coil of the energy recovery transformer configured to be coupled to the high voltage device; and
the discharge transistor is an energy recovery transistor coupled between the ground connection and the second side of the primary coil of the energy recovery transformer to release a charge of the primary coil of the energy recovery transformer to the secondary coil of the energy recovery transformer when a voltage is applied from a driver to the discharge transistor.

7. The high voltage pulse generator of claim 3, wherein the high voltage device is one of an ion source, a control for a microwave tube, a control for an x-ray tube, semiconductor processing equipment, a laser, or a semiconductor laser.

8. A high voltage pulse generator, comprising:
a pulse generating transformer having:
a primary coil with a first side and a second side; and
a secondary coil with a first side and a second side;
a direct current (DC) voltage source connection at the first side of the primary coil, wherein the DC voltage source connection is configured to be connected to a DC power supply to provide a selected voltage to the high voltage pulse generator;
a first high frequency power driver transistor coupled between the second side of the primary coil and a ground connection, the first high frequency power driver transistor configured to operate in an on-mode for a selected time period to charge the primary coil for the selected time period based on a switching frequency of the first high frequency power driver transistor, and switch the first high frequency power driver transistor to an off-mode at the switching frequency to release the charge from the primary coil to the secondary coil;
a diode coupled between the first side of the secondary coil and a pulsed voltage output that is configured to be connected to a high voltage device, the diode configured to direct a current from the secondary coil to charge a capacitance of the high voltage device to form a leading edge of a voltage pulse;
an energy recovery transformer having:
a primary coil with a first side and a second side; and
a secondary coil with a first side and a second side;
an energy recovery diode coupled between the DC voltage source and the first side of the secondary coil of the energy recovery transformer, wherein the energy recovery diode is configured to direct current from a discharge of the capacitance of the high voltage device to the DC voltage source;
the second side of the secondary coil of the energy recovery transformer is coupled to the ground connection;
the first side of the primary coil of the energy recovery transformer configured to be coupled to the high voltage device; and
an energy recovery transistor coupled between the ground connection and the second side of the primary coil of the energy recovery transformer to release a charge of the primary coil of the energy recovery transformer to the secondary coil of the energy recovery transformer when a voltage is applied from a driver to the energy recovery transistor.

9. The high voltage pulse generator of claim 8, wherein the first high frequency power driver transistor is configured to operate at a frequency between 100 Kilohertz (KHz) and 50 MHz.

10. The high voltage pulse generator of claim 8, further comprising:
a load coupled between the energy recovery transistor and the ground connection, the load configured to dissipate energy from the capacitance; or
the load coupled between the high voltage device and a ground of the energy recovery transistor, the load configured to dissipate energy from the capacitance.

11. The high voltage pulse generator of claim 8, further comprising:
a low power transformer having:
a primary coil with a first side and a second side; and
a secondary coil with a first side and a second side;
the first side of the primary coil of the low power transformer configured to be coupled to the DC voltage source;
a low power transistor coupled between the second side of the primary coil of the low power transformer and the ground connection, the low power transistor configured to operate in an on-mode for a second selected time period to charge the primary coil of the low power transformer for the second selected time period based on a switching frequency of the low power transistor, and switch the low power transistor to an off-mode at the switching frequency to release the charge from the primary coil of the low power transformer to the secondary coil of the low power transformer; and
a low power diode coupled between the first side of the secondary coil of the low power transformer and the pulsed voltage output that is configured to be connected to the high voltage device, wherein the low power diode is configured to direct current from the secondary coil of the low power transformer to the high voltage device to maintain a charge on the capacitance of the high voltage device.

12. The high voltage pulse generator of claim 11, further comprising:
a discharge transistor coupled between the high voltage device and the ground connection, the discharge transistor configured to discharge the capacitance of the high voltage device to the ground connection, when a voltage is applied from the driver to the discharge transistor, to form a trailing edge of the voltage pulse.

13. The high voltage pulse generator of claim 12, further comprising:
a load coupled between the discharge transistor and the ground connection, the load configured to dissipate energy from the capacitance;or
the load coupled between the high voltage device and a ground of the discharge transistor, the load configured to dissipate energy from the capacitance.

14. The high voltage pulse generator of claim 11, further comprising:
an energy recovery transformer having:
a primary coil with a first side and a second side; and
a secondary coil with a first side and a second side;
an energy recovery diode coupled between the DC voltage source and the first side of the secondary coil of the energy recovery transformer, wherein the energy recovery diode is configured to direct current from a discharge of the capacitance of the high voltage device to the DC voltage source;
the second side of the secondary coil of the energy recovery transformer is coupled to the ground connection;
the first side of the primary coil of the energy recovery transformer configured to be coupled to the high voltage device; and
an energy recovery transistor coupled between the ground connection and the second side of the primary coil of the energy recovery transformer to release a charge of the primary coil of the energy recovery transformer to the secondary coil of the energy recovery transformer when a voltage is applied from a driver to the energy recovery transistor.

15. The high voltage pulse generator of claim 8, wherein the high voltage device is one of an ion source, a control for a microwave tube, a control for an x-ray tube, semiconductor processing equipment, a laser, or a semiconductor laser.

16. A high voltage pulse generator, comprising:
a pulse generating transformer having:
a primary coil with a first side and a second side; and
a secondary coil with a first side and a second side;
a direct current (DC) voltage source connection at the first side of the primary coil, wherein the DC voltage source connection is configured to be connected to a DC power supply to provide a selected voltage to the high voltage pulse generator;
a first high frequency power driver transistor coupled between the second side of the primary coil and a ground connection, the first high frequency power driver transistor configured to operate in an on-mode for a selected time period to charge the primary coil for the selected time period based on a switching frequency of the first high frequency power driver transistor, and switch the first high frequency power driver transistor to an off-mode at the switching frequency to release the charge from the primary coil to the secondary coil;
a diode coupled between the first side of the secondary coil and a pulsed voltage output that is configured to be connected to a high voltage device, the diode configured to direct a current from the secondary coil to charge a capacitance of the high voltage device to form a leading edge of a voltage pulse;
a low power transformer having:
a primary coil with a first side and a second side; and
a secondary coil with a first side and a second side;
the first side of the primary coil of the low power transformer configured to be coupled to the DC voltage source;
a low power transistor coupled between the second side of the primary coil of the low power transformer and the ground connection, the low power transistor configured to operate in an on-mode for a second selected time period to charge the primary coil of the low power transformer for the second selected time period based on a switching frequency of the low power transistor, and switch the low power transistor to an off-mode at the switching frequency to release the charge from the primary coil of the low power transformer to the secondary coil of the low power transformer; and
a low power diode coupled between the first side of the secondary coil of the low power transformer and the pulsed voltage output that is configured to be connected to the high voltage device, wherein the low power diode is configured to direct current from the secondary coil of the low power transformer to the high voltage device to maintain a charge on the capacitance of the high voltage device.

* * * * *